(12) United States Patent
Iwadate et al.

(10) Patent No.: US 8,264,223 B2
(45) Date of Patent: Sep. 11, 2012

(54) MAGNETIC RESONANCE IMAGING APPARATUS

(75) Inventors: Yuji Iwadate, Tokyo (JP); Kenichi Kanda, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 464 days.

(21) Appl. No.: 12/650,266

(22) Filed: Dec. 30, 2009

(65) Prior Publication Data

US 2010/0171497 A1      Jul. 8, 2010

(30) Foreign Application Priority Data

Jan. 5, 2009    (JP) ................. 2009-000141

(51) Int. Cl.
*G01V 3/00*       (2006.01)
(52) U.S. Cl. ....................................... 324/307
(58) Field of Classification Search .......... 324/300–322; 600/410–435
See application file for complete search history.

(56) References Cited

U.S. PATENT DOCUMENTS

| | | | |
|---|---|---|---|
| 5,000,182 A | 3/1991 | Hinks | |
| 5,420,510 A | 5/1995 | Fairbanks et al. | |
| 6,073,041 A | 6/2000 | Hu et al. | |
| 7,174,200 B2 | 2/2007 | Salerno et al. | |
| 7,432,710 B2 | 10/2008 | Takei et al. | |
| 7,782,053 B2 * | 8/2010 | Kanda et al. | 324/307 |
| 8,086,003 B2 * | 12/2011 | Pfeuffer | 382/128 |

| | | | |
|---|---|---|---|
| 2004/0092809 A1 | 5/2004 | DeCharms | |

(Continued)

FOREIGN PATENT DOCUMENTS

| | | |
|---|---|---|
| JP | 2007-098026 | 4/2007 |
| JP | 2007-111188 | 5/2007 |

OTHER PUBLICATIONS

Yiping P. Du et al., "An Accurate, Robust, and Computationally Efficient Navigator Algorithm for Measuring Diaphragm Positions", Journal of Cardiovascular Magnetic Resonance, 2004, pp. 483-490, vol. 6 (2).

*Primary Examiner* — Dixomara Vargas
(74) *Attorney, Agent, or Firm* — Armstrong Teasdale LLP (57) ABSTRACT

A magnetic resonance imaging apparatus includes a scan execution unit configured to execute a regular scan in which a navigator sequence for generating a magnetic resonance signal in a navigator area containing a region of interest moving with a biological movement of a subject and an imaging sequence for generating a magnetic resonance signal in an imaging area of the subject are carried out, and a signal processing unit configured to detect a position of a region of interest based on a magnetic resonance signal generated by a navigator sequence in the regular scan and to generate an image based on the detected position and the magnetic resonance signal generated by the imaging sequence. The signal processing unit is configured to generate an intensity profile with respect to the magnetic resonance signal generated by a navigator sequence in the pre-scan and received at each of the coil elements, determine the gradient polarity of the profile line corresponding to the high-signal substance in the predetermined direction in the generated intensity profile, and to select a coil element that received a magnetic resonance signal of the intensity profile highest in maximum signal intensity among the intensity profiles the gradient polarity of which was determined to face upward. The position of the region of interest is detected based on a magnetic resonance signal generated by a navigator sequence in the regular scan and received at the selected coil element.

20 Claims, 8 Drawing Sheets

U.S. PATENT DOCUMENTS

| | | |
|---|---|---|
| 2004/0095138 A1 | 5/2004 | Foxall |
| 2006/0224062 A1 | 10/2006 | Aggarwal et al. |
| 2007/0088212 A1 | 4/2007 | Takei et al. |
| 2009/0028411 A1* | 1/2009 | Pfeuffer ................. 382/131 |
| 2009/0066329 A1* | 3/2009 | Kanda et al. .............. 324/309 |
| 2009/0259120 A1* | 10/2009 | Iwadate et al. ............ 600/410 |
| 2009/0270720 A1* | 10/2009 | Iwadate et al. ............ 600/413 |
| 2011/0080167 A1* | 4/2011 | Kannengisser et al. ...... 324/309 |

\* cited by examiner

MAGNETIC RESONANCE IMAGING APPARATUS

CROSS REFERENCE TO RELATED APPLICATIONS

This application claims the benefit of Japanese Patent Application No. 2009-000141 filed Jan. 5, 2009, which is hereby incorporated by reference in its entirety.

BACKGROUND OF THE INVENTION

The embodiments described herein relate to magnetic resonance imaging (MRI) apparatuses and in particular to a magnetic resonance imaging apparatus that detects biological movement of a subject in imaging.

Various methods have been conventionally proposed for reducing biological movement artifacts in a generated image in imaging by a magnetic resonance imaging apparatus. In a method, for example, the following processing is carried out: the position of such a region of interest as a diaphragm moving with biological movement under normal aspiration is detected; an excited section of the subject is corrected in real time in accordance with change of the position of the region of interest; and an MR (Magnetic Resonance) signal is thereby constantly acquired from the identical section. In another method, for example, the following processing is carried out: the position of such a region of interest as a diaphragm is detected; and an imaging sequence is changed or imaging data used for image generation is selected based on the detected position. (Refer to Paragraph 0047 to Paragraph 0055 of Japanese Unexamined Patent Publication No. 2007-111188, and Paragraph 0057 to Paragraph 0062 of Japanese Unexamined Patent Publication No. 2007-098026, for example.)

An example of methods for detecting the position of such a region of interest as a diaphragm is such that: a navigator area embracing that region of interest is excited to acquire an MR signal generated from this area; an intensity profile indicating the relation between a position in the navigator area and the intensity of that signal is generated; and an edge is detected in that intensity profile using a differentiation, the Du method (Refer to JOURNAL OF CARDIOVASCULAR MAGNETICRESONANCE, Vol. 6, No. 2, pp. 483-490, 2004, for example), or the like.

There is known the following method for favorably acquiring an MR signal generated in a navigator area or an imaging area: an RF coil (Radio-Frequency coil), such as a phased-array coil, having multiple coil elements is placed in proximity to a subject and an MR signal is received by this RF coil.

However, an MR signal from a navigator area received at each coil element is varied according to the positional relation between the region of interest of the subject included in the navigator area and the coil element. For this reason, if a subject or an RF coil is changed or the arrangement of an RF coil is changed, the following may take place: the most appropriate coil element that receives an MR signal with which the position of the region of interest can be most stably detected may be changed. Therefore, it is difficult to stably detect biological movement of the subject.

BRIEF DESCRIPTION OF THE INVENTION

According to a first aspect, the invention provides a magnetic resonance imaging apparatus including a scan execution unit and a signal processing unit. The scan execution unit executes regular scan in which a navigator sequence and an imaging sequence are carried out. The navigator sequence is used to generate a magnetic resonance signal in a navigator area embracing a region of interest moving with biological movement of a subject and a high-signal substance and a low-signal substance sandwiching this region of interest therebetween. The imaging sequence is used to generate a magnetic resonance signal in an imaging area of the subject. The signal processing unit detects the position of the region of interest based on a magnetic resonance signal generated by a navigator sequence in the regular scan and generates an image based on the detected position and a magnetic resonance signal generated by an imaging sequence. The magnetic resonance imaging apparatus has an RF coil including multiple coil elements. The scan execution unit executes pre-scan in which a navigator sequence is carried out before executing the regular scan. The signal processing unit includes a coil element selection unit. With respect to a magnetic resonance signal generated by a navigator sequence in the pre-scan and received at each of the coil elements, the coil element selection unit generates an intensity profile. The intensity profile indicates the relation between a position in the navigator area in a predetermined direction from one end thereof close to the high-signal substance to the other end thereof close to the low-signal substance and the intensity of the magnetic resonance signal. With respect to the multiple generated intensity profiles, the coil element selection unit determines the gradient polarity of a profile line corresponding to the high-signal substance in the predetermined direction. It then selects a coil element that received a magnetic resonance signal of the intensity profile highest in maximum signal intensity among the intensity profiles the gradient polarity of which was determined to face upward. The position of the region of interest is detected based on a magnetic resonance signal generated by a navigator sequence in the regular scan and received at the selected coil element.

The "high-signal substance" cited here is a substance from which a magnetic resonance signal is detected with relatively high intensity and the "low-signal substance" is a substance from which a magnetic resonance signal is detected with relatively low intensity.

According to a second aspect, the invention provides a magnetic resonance imaging apparatus according to the first aspect in which the coil element selection unit carries out the following processing: it determines the gradient polarity based on the magnitude relation between a representative value of signal intensity in a first range obtained by dividing an intensity profile into multiple ranges in the predetermined direction and a representative value of signal intensity in a second range.

According to a third aspect, the invention provides a magnetic resonance imaging apparatus according to the second aspect in which each of the ranges has an equal scope.

According to a fourth aspect, the invention provides a magnetic resonance imaging apparatus according to the second aspect or the third aspect in which the ranges are four ranges.

According to a fifth aspect, the invention provides a magnetic resonance imaging apparatus according to the first aspect in which the coil element selection unit carries out the processing of: detecting the position of the region of interest based on at least one of the generated intensity profiles; and determining the gradient polarity based on the magnitude relation between the following representative values: a representative value of signal intensity in a range between an end in an intensity profile on the near side in the predetermined direction and a position at a predetermined distance from this end in the predetermined direction; and a representative value of signal intensity in a range between the detected position and a position at the predetermined distance from this position in the direction opposite the predetermined direction.

According to a sixth aspect, the invention provides a magnetic resonance imaging apparatus according to the fifth aspect in which the predetermined distance is a distance equivalent to any between 10 millimeters and 30 millimeter in real space.

According to a seventh aspect, the invention provides a magnetic resonance imaging apparatus according to any of the second aspect to the sixth aspect in which the representative value of signal intensity is a signal intensity in the center position in a target range.

According to an eighth aspect, the invention provides a magnetic resonance imaging apparatus according to any of the second aspect to the sixth aspect in which the following is implemented: the representative value of signal intensity is the sum total or the average value of signal intensity in each position in a target range.

According to a ninth aspect, the invention provides a magnetic resonance imaging apparatus according to any of the first aspect to the eighth aspect in which the coil element selection unit selects the following coil elements: a first coil element that received a magnetic resonance signal of the intensity profile highest in maximum signal intensity among the intensity profiles the gradient polarity of which was determined to face upward; and a second coil element that received a magnetic resonance signal of the intensity profile highest in maximum signal intensity among the intensity profiles the gradient polarity of which was determined to face downward. The signal processing unit detects the predetermined position based on magnetic resonance signals generated by a navigator sequence and received at the first and second coil elements.

According to a tenth aspect, the invention provides a magnetic resonance imaging apparatus according to the ninth aspect in which the following is implemented: with respect to a signal obtained by synthesizing a magnetic resonance signal received at the first coil element and a magnetic resonance signal received at the second coil element, the signal processing unit generates an intensity profile. The intensity profile indicates the relation between a position in the navigator area and the intensity of the synthesized signal. The signal processing unit detects the position of the region of interest based on this intensity profile.

According to an eleventh aspect, the invention provides a magnetic resonance imaging apparatus according to the 10th aspect in which the following is implemented: the synthesized signal is the square root of the sum of the square of a magnetic resonance signal received at the first coil element and the square of a magnetic resonance signal received at the second coil element.

According to a twelfth, the invention provides a magnetic resonance imaging apparatus according to any of the first aspect to the 11th aspect in which the following is implemented: the coil elements includes four or more coil elements placed in proximity to the front of the subject and four or more coil elements placed in proximity to the back of the subject.

According to a thirteenth, the invention provides a magnetic resonance imaging apparatus according to any of the first aspect to the 12th aspect in which the following is implemented: the signal processing unit generates an image based on a magnetic resonance signal generated by an imaging sequence temporally corresponding to a navigator sequence carried out when the detected position of the region of interest is within a predetermined range.

According to a fourteenth, the invention provides a magnetic resonance imaging apparatus according to any of the first aspect to the 13th aspect in which the biological movement is based on respiratory movement or heart beat movement.

According to a fifteenth, the invention provides a magnetic resonance imaging apparatus according to any of the first aspect to the 14th aspect in which the region of interest is diaphragm, the high-signal substance is liver, and the low-signal substance is lung.

According to a sixteenth, the invention provides a magnetic resonance imaging apparatus according to any of the first aspect to the 14th aspect in which the following is implemented: the region of interest is the surface area of kidney, the high-signal substance is liver or fat, and the low-signal substance is kidney.

According to a seventeenth, the invention provides a magnetic resonance imaging apparatus according to any of the first aspect to the 14th aspect in which the following is implemented: the region of interest is the surface area of head, the high-signal substance is head, and the low-signal substance is air.

According to an eighteenth, the invention provides a magnetic resonance imaging apparatus according to any of the first aspect to the 17th aspect in which the signal processing unit detects the position of the region of interest using an edge detection method.

According to the invention, it is possible to automatically select the coil element most appropriate to acquiring an MR signal for the detection of biological movement from among the multiple coil elements including an RF coil and to stably detect biological movement of a subject regardless of the arrangement of the RF coil. As a result, it is possible to further reduce biological movement artifacts in a generated image.

Further objects and advantages of the present invention will be apparent from the following description of the preferred embodiments of the invention as illustrated in the accompanying drawings.

DETAILED DESCRIPTION OF THE INVENTION

Hereafter, description will be given to an embodiment of the invention. An MRI apparatus (magnetic Resonance Imaging apparatus) 1 in this embodiment detects biological movement of a subject based on an MR signal (Magnetic Resonance signal) from a navigator area received at a phased-array coil. Then it generates an image based on an MR signal from an imaging area acquired when biological movement is gentle. The MRI apparatus 1 is characterized in that at this time it automatically selects a coil element most appropriate to acquiring an MR signal for biological movement detection from among the multiple coil elements including the phased-array coil. The invention is not limited to the embodiment described below.

Figure 1:
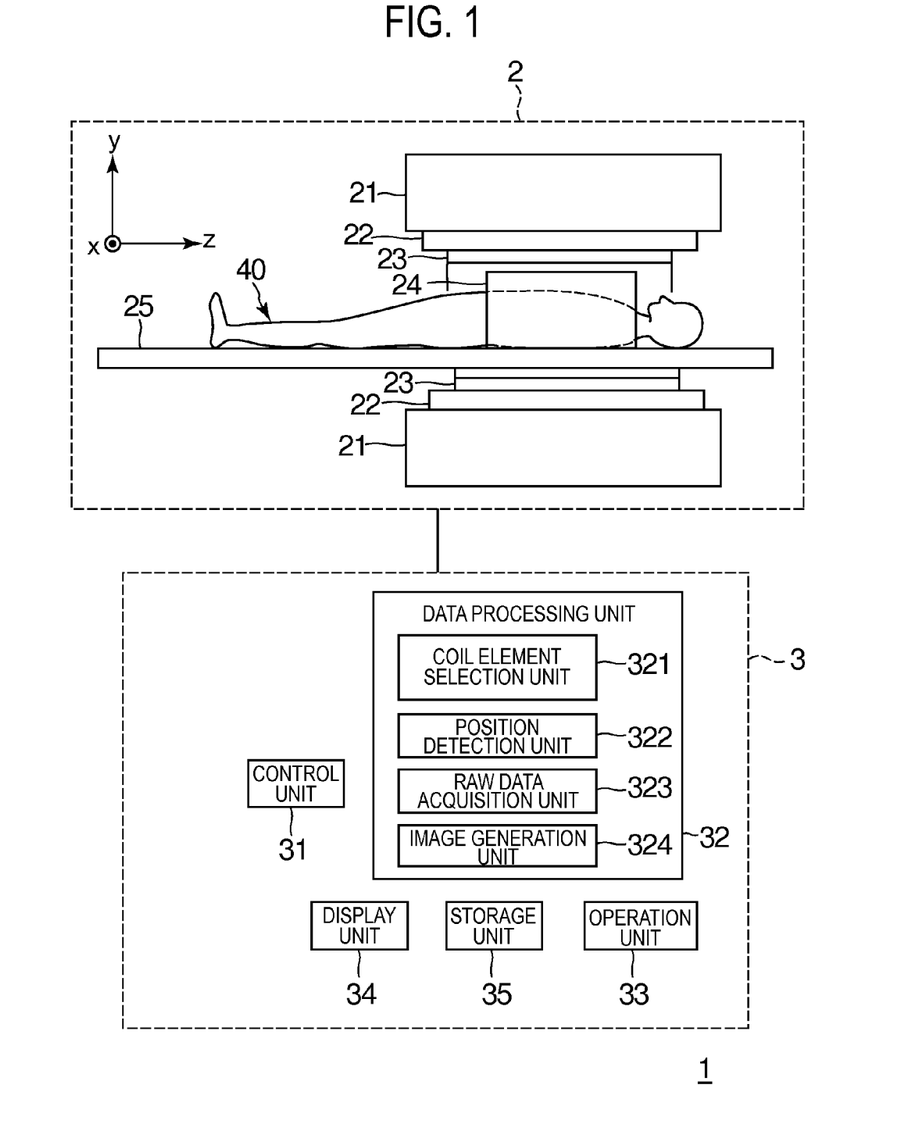
FIG. 1 is a drawing illustrating the configuration of an MRI apparatus in an embodiment.

FIG. 1 illustrates the configuration of the MRI apparatus (Magnetic Resonance Imaging apparatus) 1 in this embodiment.

As illustrated in FIG. 1, the MRI apparatus 1 includes a scan unit 2 and an operation console unit 3. The coordinate system xyz illustrated in FIG. 1 is the coordinate system of the entire MRI apparatus 1.

Description will be given to the scan unit 2.

As illustrated in FIG. 1, the scan unit 2 includes a static magnetic field magnet unit 21, a gradient coil unit 22, an RF whole body coil unit 23, an RF phased-array coil unit (RF coil) 24, and a table unit 25.

The scan unit 2 executes scan under control of the control unit 31 described later. In scan, it selects a target area of a subject 40 in an imaging space with a static magnetic field formed therein by a gradient field. It applies an electromagnetic wave to the subject 40 to generate an MR signal in the target area and receives this signal.

Description will be given to each constituent element of the scan unit 2 one by one.

The static magnetic field magnet unit 21 is comprised of, for example, a superconducting magnet and forms a static magnetic field in the imaging space in which the subject 40 is placed. In this example, the static magnetic field magnet unit 21 forms a static magnetic field along the direction (z direction) of the body axis of the subject 40. The static magnetic field magnet unit 21 may be comprised of a pair of permanent magnets.

The gradient coil unit 22 forms a gradient field in the imaging space with the static magnetic field formed therein and adds spatial position information to an MR signal received by the RF whole body coil unit 23 or the RF phased-array coil unit 24. In this example, the gradient coil unit 22 is comprised of three systems in the x direction, y direction, and z direction and forms a gradient field in each of frequency encode direction, phase encode direction, and slice selection direction according to an imaging condition. Specifically, the gradient coil unit 22 applies a gradient field in the slice selection direction of the subject 40 and selects a slice of the subject 40 excited by the RF whole body coil unit 23 transmitting an RF pulse (Radio-Frequency pulse). In addition, the gradient coil unit 22 applies a gradient field in the phase encode direction of the subject 40 and phase-encodes an MR signal from a slice excited by an RF pulse. Further, the gradient coil unit 22 applies a gradient field in the frequency encode direction of the subject 40 and frequency-encodes an MR signal from a slice excited by an RF pulse.

As illustrated in FIG. 1, the RF whole body coil unit 23 is so placed that it encircles the subject 40. The RF whole body coil unit 23 transmits an RF pulse as an electromagnetic wave to the subject 40 in the imaging space in which a static magnetic field is formed by the static magnetic field magnet unit 21. It thereby forms a high-frequency magnetic field to excite the spin of protons in the subject 40.

As illustrated in FIG. 1, the RF phased-array coil unit 24 is placed in proximity to the subject 40. The RF phased-array coil unit 24 receives as an MR signal an electromagnetic wave generated from protons excited in the subject 40. The MR signals generated at the subject 40 can also be received at the RF whole body coil unit 23.

Figure 2:
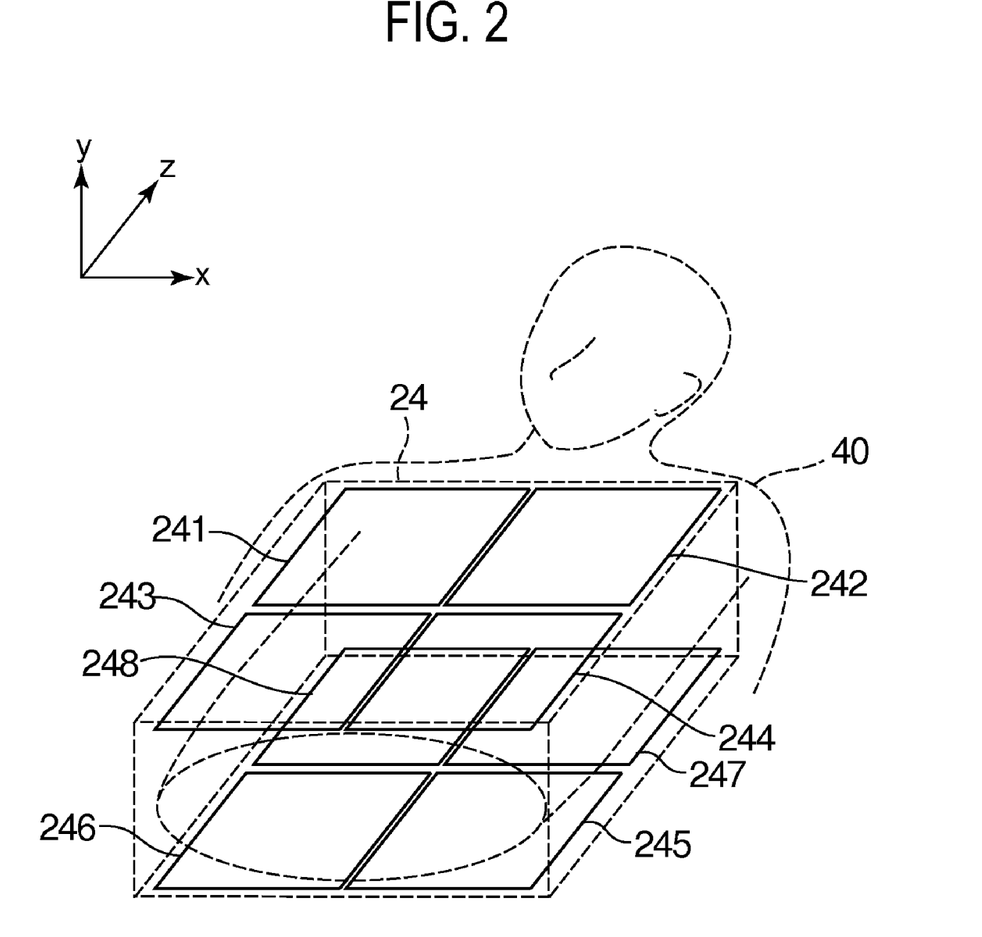
FIG. 2 is a drawing illustrating the configuration of an RF phased-array coil unit.

FIG. 2 illustrates the configuration of the RF phased-array coil unit 24.

The RF phased-array coil unit 24 is a multi-channel coil including multiple coil elements. In this embodiment, as illustrated in FIG. 2, it is comprised of eight coil elements 241 to 248. In FIG. 2, the connecting wire of each coil element is omitted. Each coil element is a single-loop coil, for example, in the shape of circle with a diameter of 15 to 20 cm or so or in the shape of square, 15 to 20 cm or so on a side. The coil elements 241 to 248 are arranged in an array pattern with the loop surfaces of the coils in parallel with the xz-plane. The coil elements 241 to 244 are arranged in an 2×2 array on the front side of the subject 40 and the coil elements 245 to 248 are arranged in a 2×2 array on the back side of the subject 40. There are different types in phased-array coil: a type that the loop surfaces are placed so that they partly overlap each other between coil elements and a type that the loop surfaces are placed so that they do not overlap each other. Either type is acceptable. When the RF phased-array coil 24 is installed with the common positional relation to the subject 40, the following takes place: the coil elements 241, 242, 247, 248 are positioned on the breast side of the subject 40 and the coil elements 243, 244, 245, 246 are positioned on the abdomen side of the subject 40.

The table unit 25 includes a platform on which the subject 40 is placed. The table unit 25 is moved between the interior and the exterior of the imaging space based on a control signal from the operation console unit 3.

Description will be given to the operation console unit 3.

As illustrated in FIG. 1, the operation console unit 3 includes the control unit (scan execution unit) 31, a data processing unit (signal processing unit) 32, an operation unit 33, a display unit 34, and a storage unit 35.

Description will be given to each constituent element of the operation console unit 3 one by one.

The control unit 31 carries out a sequence for performing the application of an RF pulse, the application of a gradient field, and the reception of an MR signal with predetermined timing. It transmits a control signal to the scan unit 2 to execute scan.

In this example, the control unit 31 carries out a navigator sequence and an imaging sequence. In the navigator sequence, an RF pulse is applied to a navigator area to generate an MR signal from the navigator area and this MR signal is received. In the imaging sequence, an RF pulse is applied to an imaging area to generate an MR signal from the imaging area and this MR signal is received.

Figure 3:
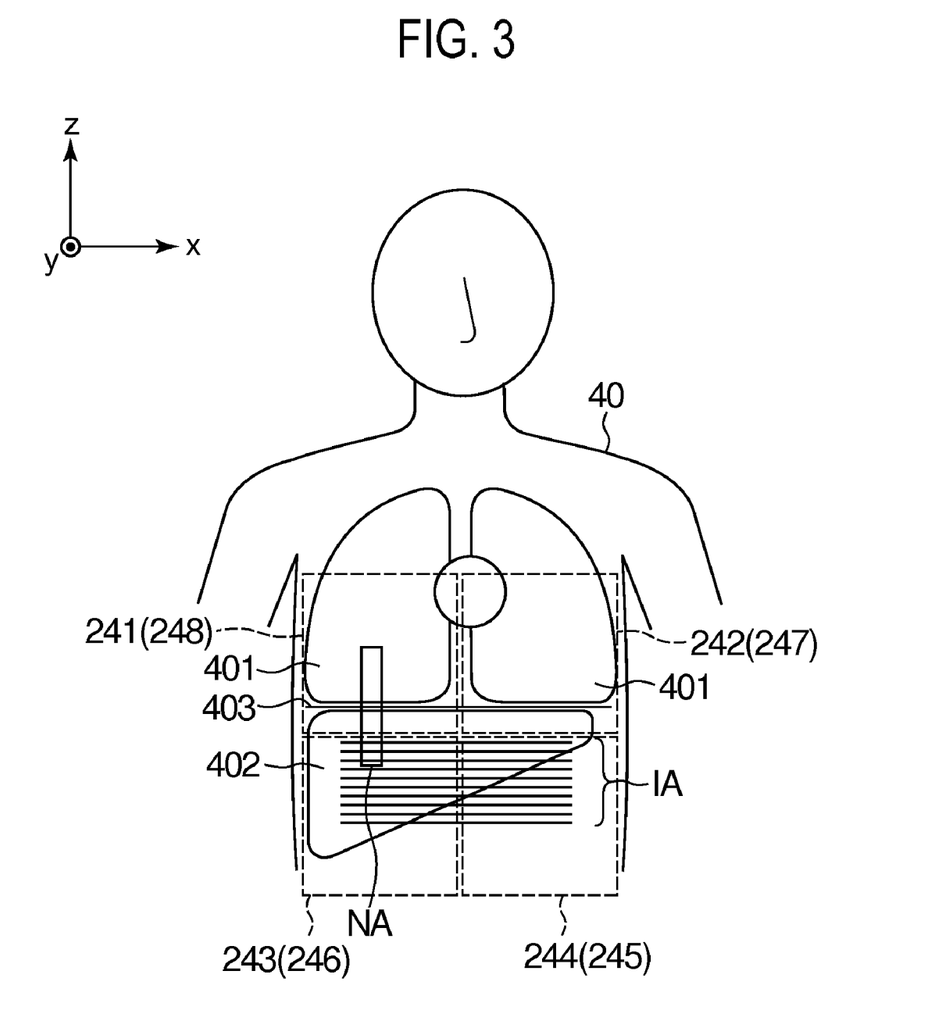
FIG. 3 is a drawing illustrating a navigator area and an imaging area.

FIG. 3 illustrates an example of a navigator area and an imaging area.

The navigator area is so set that it embraces a region of interest moving with biological movement of the subject 40 and a high-signal substance and a low-signal substance sandwiching this region of interest therebetween. The high-signal substance cited here is a substance from which an MR signal is detected with relatively high intensity and the low-signal substance is a substance from which an MR signal is detected with relatively low intensity. This makes it possible to detect the position and movement amount of the region of interest based on a difference in the intensity of an MR signal generated in the navigator area from position to position and detect biological movement of the subject 40. In this example, as illustrated in FIG. 3, the above-mentioned high-signal substance is the liver 402 and the above-mentioned low-signal substance is the lungs 401. The above-mentioned region of interest is set to the diaphragm 403 positioned between the lungs 401 and the liver 402 of the subject 40. The area extended along the direction of the body axis (z direction) with the diaphragm 403 substantially at the center is set as the navigator area NA. In addition, a predetermined area on the abdomen of the subject 40 is set as the imaging area IA. The positions of the coil elements 241 to 248 illustrated in FIG. 3 are positions obtained when the RF phased-array coil unit 24 is placed with the common positional relation to the subject 40. The navigator area and the imaging area may partly overlap each other.

Figure 4:
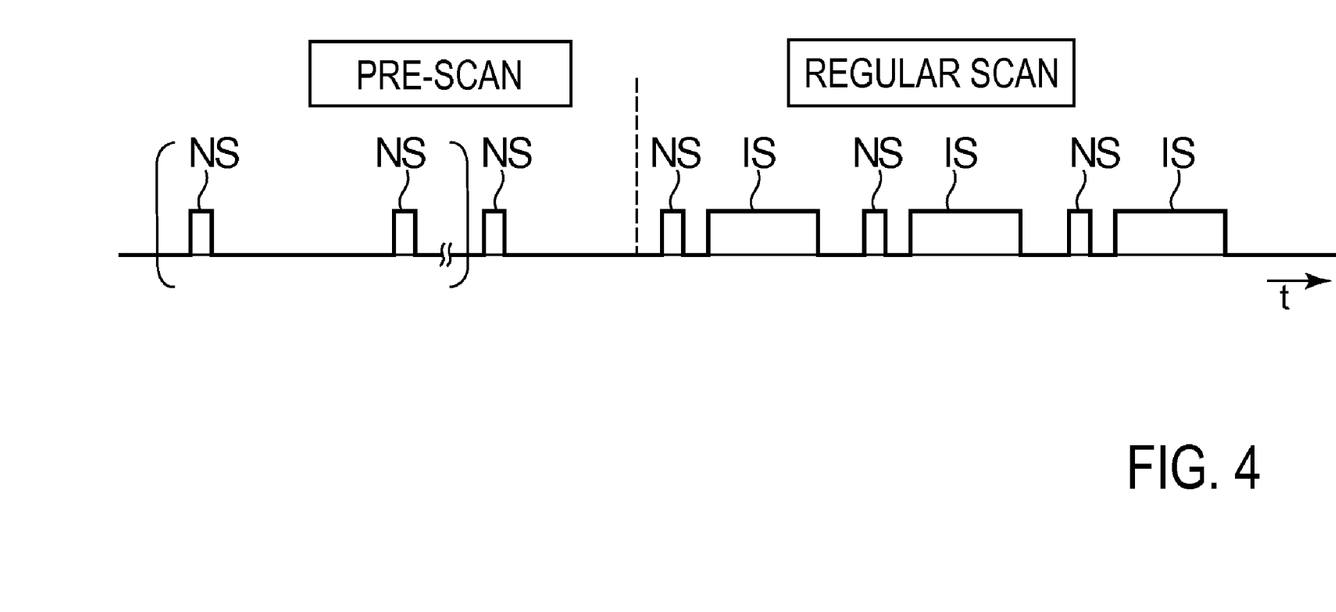
FIG. 4 is a drawing illustrating an example of a time chart of a sequence carried out in scan in this embodiment.

FIG. 4 illustrates an example of a time chart of a sequence carried out in scan in this embodiment.

As illustrated in FIG. 4, the control unit 31 executes prescan in which a navigator sequence is carried out at least once and regular scan in which after this pre-scan, a navigator sequence and an imaging sequence are repeatedly carried out more than once.

As illustrated in FIG. 1, the data processing unit 32 includes a coil element selection unit 321, a position detection unit 322, a raw data acquisition unit 323, and an image generation unit 324.

Description will be given to each constituent element of the data processing unit 32 one by one.

The coil element selection unit 321 acquires an MR signal generated by the execution of a navigator sequence in prescan and received at each coil element including the RF phased-array coil unit 24. Then it selects a coil element most appropriate to acquiring an MR signal for detecting biological movement of the subject 40 during regular scan from among the above-mention coil elements based on the acquired MR signals. Detailed description will be given later to a method for selecting a coil element.

The position detection unit 322 carries out a navigator sequence in regular scan and detects the position or movement amount of the diaphragm 403 of the subject 40 based on an MR signal received at the selected coil element. For example, it subjects the received MR signal to one-dimension Fourier transformation to generate an intensity profile indicating the relation between a position in the navigator area NA and the intensity of the MR signal. Then it detects the position of the diaphragm 403 in the intensity profile. To detect the position of the diaphragm 403, for example, differentiation or an edge detection method, such as the Du method disclosed in Non-patent Document 1, can be used. The Du method is such that the position of the point of intersection of the profile line of an intensity profile and a predetermined threshold value line of signal intensity is detected as the position of the diaphragm 403.

The raw data acquisition unit 323 acquires the following MR signal as raw data: an MR signal generated by an imaging sequence temporally corresponding to a navigator sequence carried out when the position detected by the position detection unit 322 is within a predetermined range in which biological movement of the subject 40 is considered to be gentle.

As the above-mentioned biological movement, in this example, periodical biological movement based on respiratory movement of the subject 40 is assumed. Consequently, the above-mentioned predetermined range is set to a position range equivalent to maximal inspiration or maximal expiration in respiratory phase in which the movement of the diaphragm 403 is gentlest.

The image generation unit 33 generates an MR image based on raw data acquired by the raw data acquisition unit 323.

The operation unit 34 is comprised of an operating device, such as a keyboard and a pointing device. The operation unit 34 is inputted with operating data by an operator and outputs this operating data to each part.

The display unit 35 includes a display device such as CRT (Cathode Ray Tube) and displays an image on a display screen. For example, the display unit 35 displays multiple images associated with input items about which operating data is inputted to the operation unit 34 by an operator on the display screen. In addition, the display unit 35 receives data pertaining to a slice image of the subject 40 generated based on an MR signal from the subject 40 from the image generation unit 324 and displays this slice image on the display screen.

The storage unit 36 is comprised of a memory and stores varied data. The storage unit 36 is accessed when the stored data is required.

Detailed description will be given to a method for selecting a coil element.

First, an MR signal received at each of the coil elements 241 to 248 is acquired and subjected to one-dimension Fourier transformation. Then an intensity profile indicating the relation between a position in a navigator area and the intensity of the MR signal is generated with respect to each coil element.

Figure 5:
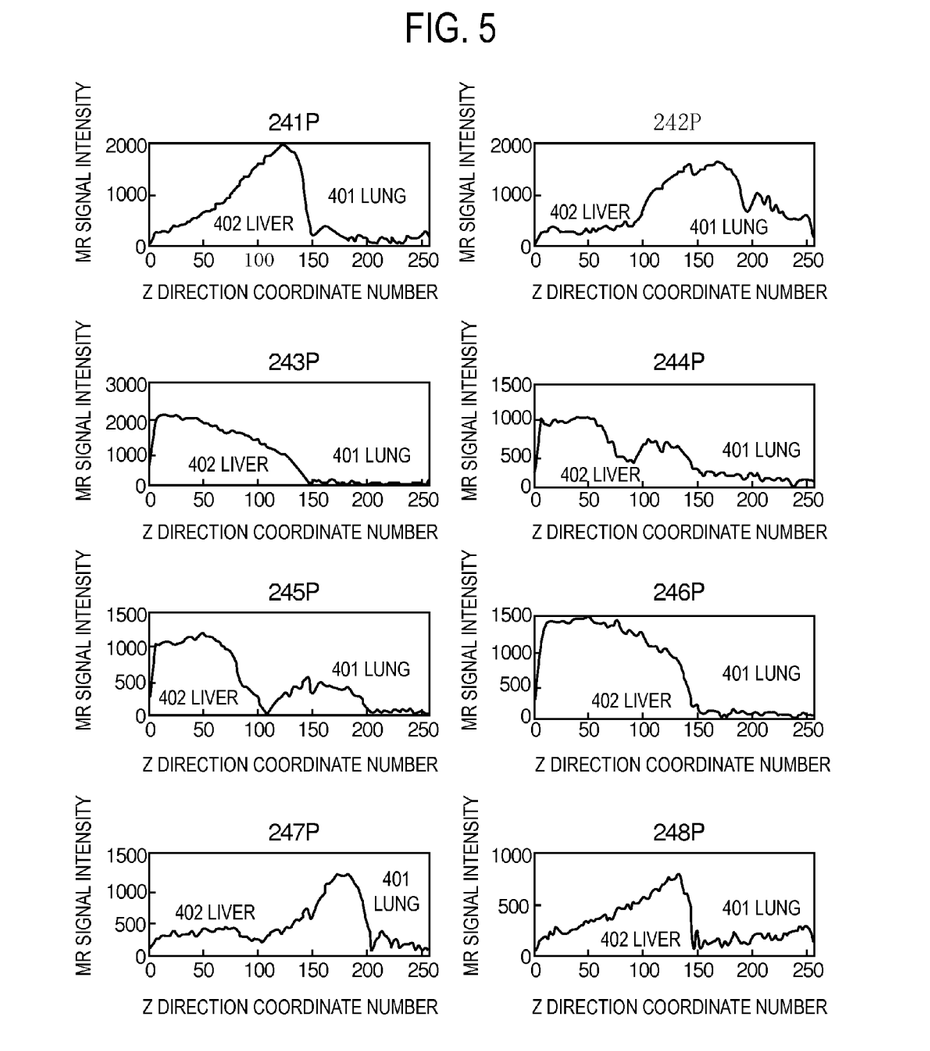
FIG. 5 is a drawing illustrating an example of the intensity profile of each coil element.

FIG. 5 illustrates an example of the intensity profile of each coil element. The intensity profiles 241P to 248P respectively correspond to the coil elements 241 to 248 in this embodiment. In each intensity profile, the horizontal axis is taken for coordinate number indicating a position in the +z direction and the vertical axis is taken for the relative value of the intensity of an MR signal. The +z direction is a predetermined direction from one end of a navigator area NA close to a high-signal substance to the other end close to a low-signal substance.

Usually, the navigator area NA includes a region of interest and a high-signal substance, where the signal intensity is relatively high, and a low-signal substance, where the signal intensity is relatively low, sandwiching the region of interest therebetween. In the intensity profiles illustrated in FIG. 5, areas with a relatively small coordinate number in the z direction are equivalent to the liver 402 substantially composed of a high-signal substance; and areas with a relatively large coordinate number in the z direction are equivalent to the lung 401 substantially composed of a low-signal substance.

Next, with respect to the multiple generated intensity profiles 241P to 248P, the gradient polarity of each profile line corresponding to the high-signal substance in the above-mentioned predetermined direction (+z direction) is determined As mentioned above, the navigator area NA includes the high-signal substance and the low-signal substance with the region of interest sandwiched therebetween. In the intensity profile of an MR signal from such a navigator area, the gradient polarity facing upward or downward appears in the profile line corresponding to the high-signal substance. The gradient polarity is characterized in that: in an coil element positioned close to the high-signal substance with respect to the region of interest in the predetermined direction, the gradient polarity of the profile line corresponding to the high-signal substance faces downward in the predetermined direction; and in a coil element positioned close to the low-signal substance with respect to the region of interest, the gradient polarity of the profile line corresponding to the high-signal substance faces upward in the predetermined direction. In this embodiment, the region of interest is the diaphragm 408, the high-signal substance is the liver 402, and the low-signal substance is the lungs 401. Therefore, the gradient polarity of the profile line corresponding to the liver 402 in the direction of +z is determined (This direction is a direction in which the coordinate number in the z direction is increased and corresponds to the head-tail direction of the subject 40 in this embodiment.)

When "gradient polarity" is simply cited in the following description, it means the gradient polarity of the profile line corresponding to the high-signal substance in the above-mentioned predetermined direction (+z direction).

Description will be given to examples of determination methods for the gradient polarity of an intensity profile. The invention is not limited to these gradient polarity determination methods.

Figure 6:
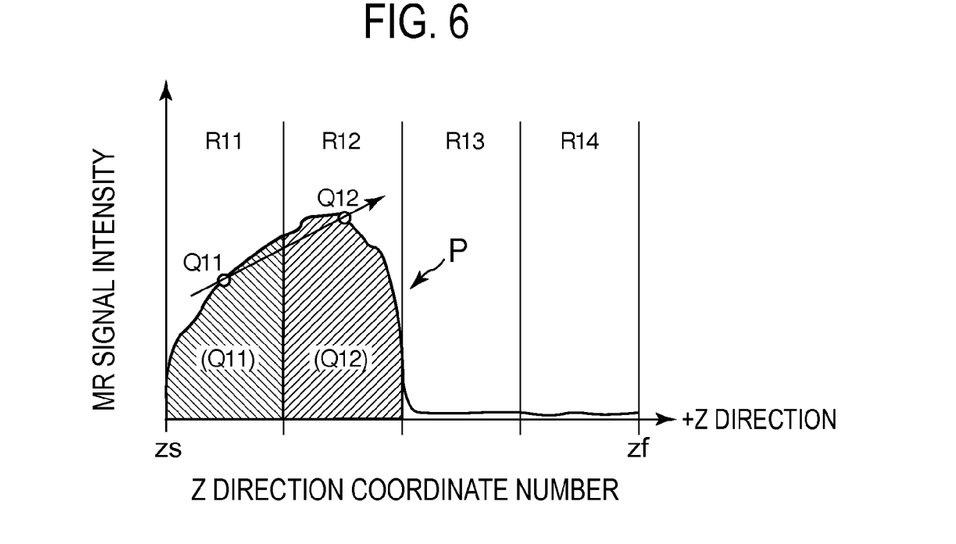
FIG. 6 is a drawing explaining a first gradient polarity determination method.

FIG. 6 explains a first gradient polarity determination method.

In the first gradient polarity determination method, first, a range at coordinates zs to zf corresponding to the navigation area NA in an intensity profile P to be determined is divided into multiple ranges, for example, four ranges R11 to R14 as illustrated in FIG. 6. It is desirable that the multiple ranges have an equal scope.

Then, the representative value Q11 of signal intensity in the first divided range (first range) R11 in the +z direction, or the above-mentioned predetermined direction, is determined. The representative value Q12 of signal intensity in the second divided range (second range) R12 in the +z direction is determined. For the representative value of signal intensity, for example, the signal intensity in the center position in a target divided range or the average value, intermediate value, sum total (area) or the like of signal intensity in each position in that divided range is taken.

The magnitude relation between the representative value Q11 and the representative value Q12 is determined When Q11<Q12, the gradient polarity is determined to face upward; and when Q11>Q12, the gradient polarity is determined to face downward. When Q11=Q12, it may be determined to face upward or downward.

Figure 7:
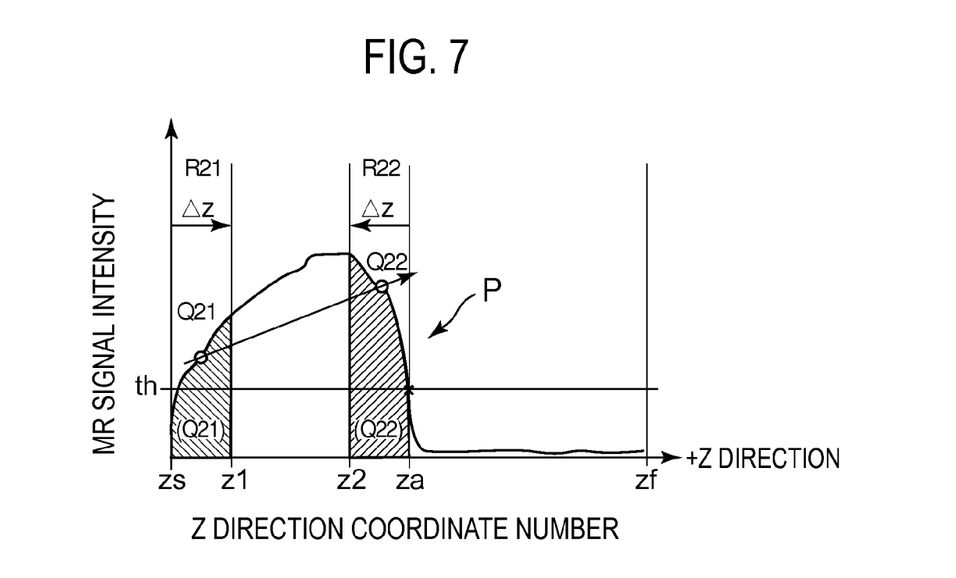
FIG. 7 is a drawing explaining a second gradient polarity determination method.

FIG. 7 explains a second gradient polarity determination method.

In the second gradient polarity determination method, first, the position za corresponding to the position of the region of interest, or the diaphragm 403, is determined based on at least one of the generated intensity profiles as illustrated in FIG. 7. For example, the position of the diaphragm 403 is detected in any one intensity profile using the edge detection method described later and the detected position is taken as position za. (An example of edge detection methods is such that the position of intersection between a profile line and a signal intensity threshold value line th is detected.) For example, the position of the diaphragm 403 is similarly detected in all the intensity profiles and the average position, intermediate position, or the like of the detected positions is taken as position za.

Subsequently, the representative value Q21 of signal intensity in range R21 is determined. This is a range starting at one end zs of the navigation area NA and extended to position z1 at a predetermined distance Δz from the one end in the +z direction, or the above-mentioned predetermined direction. Then the representative value Q22 of signal intensity in range R22 is determined. This is a range starting in the position za detected first and extended to position z2 at the predetermined distance Δz from the starting position in the −z direction, or the direction opposite the above-mentioned predetermined direction. For the representative value of signal intensity, for example, the signal intensity in the center position in a target range or the average value, intermediate value, sum total (area), or the like of signal intensity in each position in that range is taken as mentioned above. The predetermined distance Δz is set to, for example, a distance equivalent to any between 4 mm and 100 mm in real space; however, a distance of 10 to 30 mm or so is especially preferable.

The magnitude relation between the representative value Q21 and the representative value Q22 is determined When Q21<Q22, the gradient polarity is determined to face upward; and when Q21>Q22, the gradient polarity is determined to face downward. When Q21=Q22, it may be determined to face upward or downward.

An intensity profile the gradient polarity of which was determined to face upward is selected. The intensity profile whose gradient polarity facing upward is characterized in that the signal intensity significantly changes, in other words, the gradient of the profile line becomes steep in proximity to the region of interest. In such an intensity profile, the boundary between the high-signal substance and the low-signal substance appears as a strong edge on the profile line. Therefore, the position of the region of interest corresponding to this boundary can be detected with accuracy and stability. In this example, of the eight intensity profiles illustrated in FIG. 5, those whose gradient polarity faces upward are the intensity profiles 241P, 242P, 247P, and 248P; therefore, these intensity profiles are selected.

Of the selected intensity profiles, an intensity profile highest in maximum signal intensity is identified. When the signal intensity is high, the boundary between the high-signal substance and the low-signal substance appears as a strong edge on the profile line; therefore, the position of the region of interest can be detected with accuracy and stability. In this example, of the intensity profiles 241P, 242P, 247P, and 248P illustrated in FIG. 5, the intensity profile 241P highest in maximum signal intensity is identified.

Then a coil element that received an MR signal of the identified intensity profile is selected. In this example, the coil element 241 corresponding to the identified intensity profile 241P is selected.

Description will be given to operation performed by the MRI apparatus 1 in this embodiment during imaging.

Figure 8:
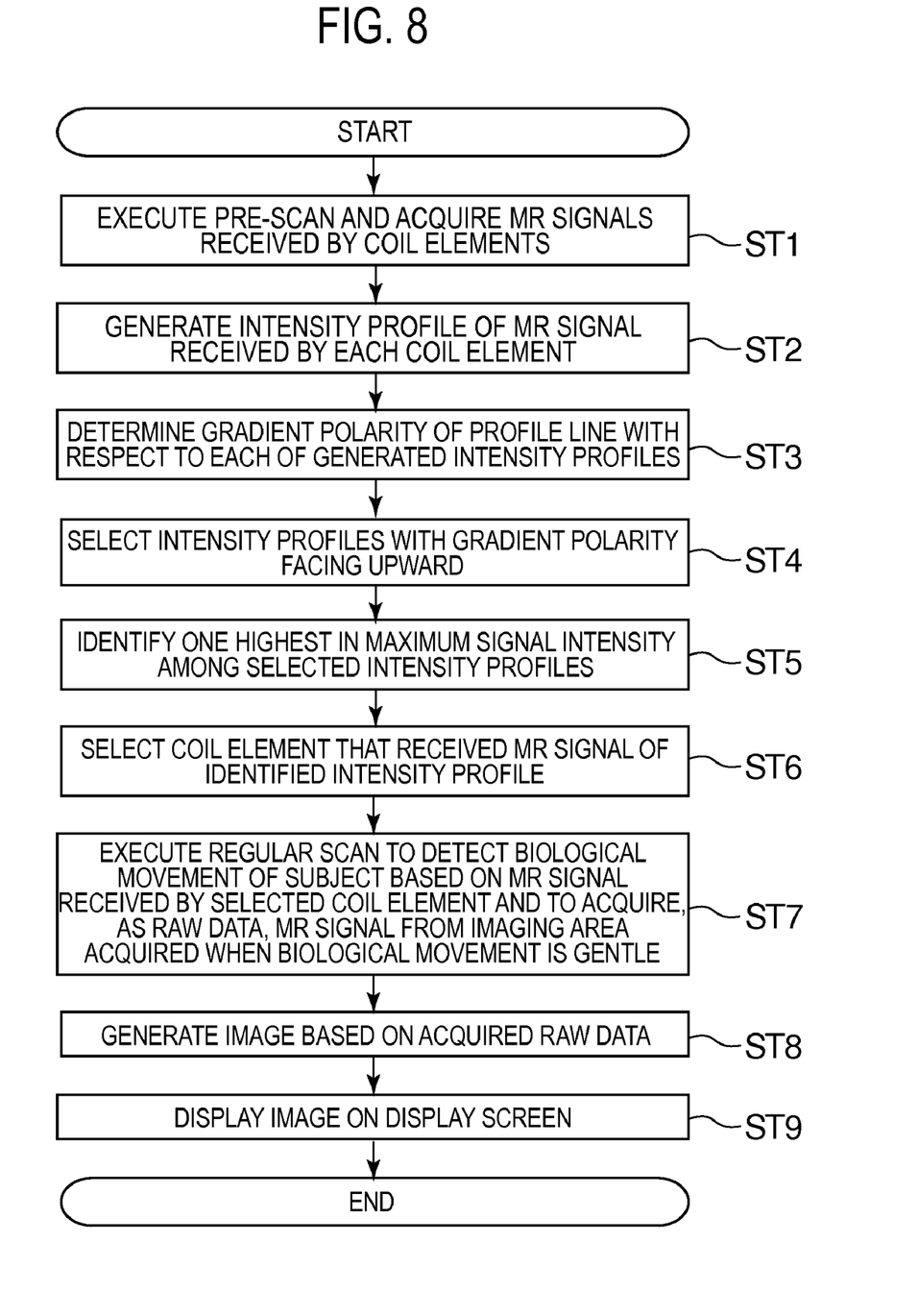
FIG. 8 is a flowchart illustrating an example of operation performed in imaging by an MRI apparatus in this embodiment.

FIG. 8 is a flowchart illustrating an example of operation of the MRI apparatus in this embodiment during imaging.

At Step ST1, the control unit 31 executes pre-scan to carry out a navigator sequence once or more and the coil element selection unit 321 acquires MR signals from the navigator area NA received at the individual coil elements 241 to 248.

At Step ST2, the coil element selection unit 322 generates an intensity profile with respect to the MR signal from each coil element acquired at Step ST1.

At Step ST3, the coil element selection unit 321 carries out the following processing with respect to the intensity profiles generated at Step ST2: it determines the gradient polarity of the profile line corresponding to the high-signal substance in the predetermined direction from the high-signal substance to the low-signal substance.

At Step ST4, the coil element selection unit 321 selects intensity profiles whose gradient polarity was determined to face upward at Step ST3.

At Step ST5, the coil element selection unit 321 identifies an intensity profile highest in maximum signal intensity among the intensity profiles selected at Step ST4.

At Step ST6, the coil element selection unit 321 selects a coil element that received the MR signal on which the intensity profile identified at Step ST5 is based.

At Step ST7, the control unit 31 executes regular scan to repeatedly carry out a navigator sequence and an imaging sequence more than once. At this time, the position detection unit 322 carries out the following processing based on the MR signal from the navigator area NA received at the coil element selected at Step ST6: it detects the position of the diaphragm 403 to detect biological movement of the subject 40. The raw data acquisition unit 323 acquires as raw data an MR signal from the imaging area IA acquired when change in biological movement is gentle.

At Step ST8, the image generation unit 324 generates an image based on the raw data acquired at Step ST7.

At Step ST9, the display unit 35 displays the image generated at Step ST8 on the display screen.

According to the MRI apparatus 1 in this embodiment, as described up to this point, the following can be implemented: a coil element most appropriate to acquiring an MR signal for detecting biological movement can be automatically selected from among the coil elements 241 to 248 including the RF phased-array coil unit 24; and biological movement of the subject 40 can be stably detected regardless of the arrangement of the RF phased-array coil unit 24. As a result, it is possible to further reduce biological movement artifacts in a generated image.

In this embodiment, only one coil element is selected as a source from which an MR signal for detecting biological movement is acquired. Instead, the following measure may be taken: two or more coil elements are selected from among the coil elements including the RF phased-array coil unit 24; and biological movement of the subject 40 is detected based on multiple MR signals received at the selected coil elements and acquired therefrom.

Figure 9:
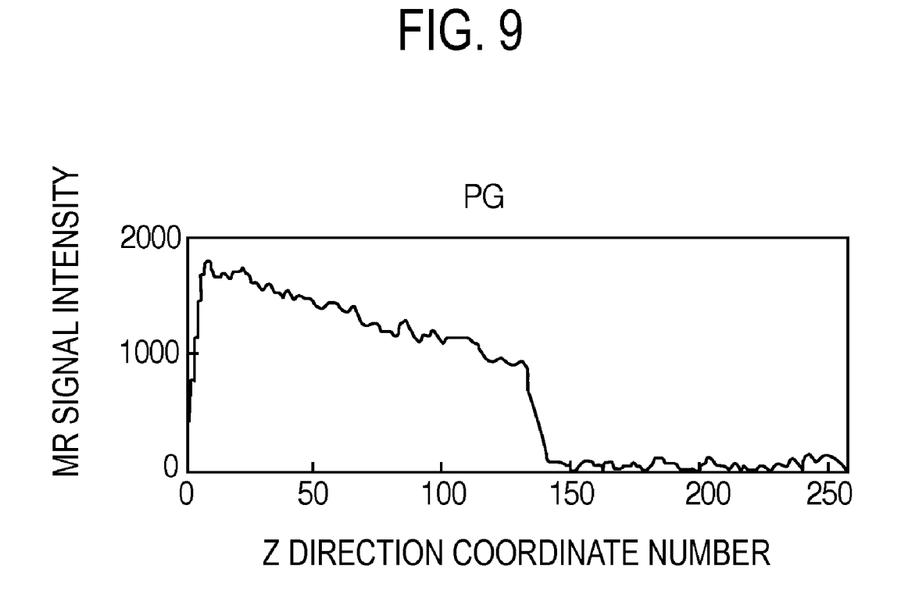
FIG. 9 is a drawing illustrating an example of the intensity profile of a signal obtained by synthesizing two MR signals received by two selected coil elements.

For example, the following coil elements are selected: a first coil element that received an MR signal on which the intensity profile highest in maximum signal intensity is based among the intensity profiles with the gradient polarity facing upward of the intensity profiles 241P to 248P of the individual coil elements; and a second coil element that received an MR signal on which the intensity profile highest in maximum signal intensity is based among the intensity profiles with the gradient polarity facing downward. In case of the example in FIG. 5, the intensity profiles 241P and 243P are selected. Then the MR signal received at the first coil element and the MR signal received at the second coil element are synthesized to generate a signal. Then the position of the region of interest, such as the diaphragm, may be detected based on this synthesized signal. This synthesized signal can be obtained as, for example, the square root of the sum of the square of the MR signal received at the first coil element and the square of the MR signal received at the second coil element. FIG. 9 illustrates an example of the intensity profile PG of the above-mentioned synthesized signal.

According to this measure, the position of the region of interest, such as the diaphragm, can be detected based on a more stable intensity profile in which noise is less prone to appear and this enhances the stability and accuracy of position detection.

In this embodiment, the diaphragm 403 positioned between the lungs 401 and the liver 402 is taken as the region of interest moving with biological movement based on the respiratory movement of the subject 40. The invention is not limited to this and any other region may be taken as the region of interest as long as it moves with biological movement based on respiratory movement. For example, the surface area of head, the surface area of kidney, and the like are acceptable. When the region of interest is the surface area of head, for example, the high-signal substance is head and the low-signal substance is air. When the region of interest is the surface area of kidney, for example, the high-signal substance is liver or fat and the low-signal substance is kidney.

In the description of this embodiment, a case where biological movement artifacts associated with respiratory movement of the subject 40 are suppressed has been taken as an example but the invention is not limited to this. For example, the invention is also applicable to cases where biological movement artifacts associated with heart beat movement of the subject 40 are suppressed.

In this embodiment, the navigator area is set along the z direction (the direction of the body axis of the subject 40) and biological movement in the z direction is detected. However, the invention is not limited to this. For example, the following measure may be taken: the navigator area is set in the x direction or in an oblique direction on the xz-plane; and biological movement in the x direction or in the oblique direction is detected.

In this embodiment, the RF phased-array coil unit 24 is comprised of eight coil elements. However, there is no limitation on the number of coil elements, needless to add. On the contrary, as the number of coil elements is increased, the effect that biological movement artifacts in a generated image can be stably reduced is enhanced. Since it is very troublesome to manually select the most appropriate coil element, it is impossible as a matter of practice to compel users to do this work. The position of the RF phased-array coil unit 24 relative to the subject 40 varies each time the RF phased-array coil unit 24 is attached or detached. Therefore, if the source from which an MR signal for detecting biological movement is acquired is fixed to a specific coil element, the detection position of the region of interest becomes instable. In this embodiment, meanwhile, the most appropriate coil element can be automatically selected and these problems do not arise.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance imaging apparatus comprising:
a scan execution unit configured to:
execute a regular scan in which a navigator sequence for generating a magnetic resonance signal in a navigator area containing a region of interest moving with a biological movement of a subject and a high-signal substance and a low-signal substance sandwiching the region of interest therebetween is carried out; and
execute an imaging sequence for generating a magnetic resonance signal in an imaging area of the subject;
a signal processing unit configured to:
detect a position of the region of interest based on a magnetic resonance signal generated by a navigator sequence in the regular scan; and
generate an image based on the detected position and the magnetic resonance signal generated by the imaging sequence;
an RF coil comprising a plurality of coil elements, said scan execution unit is configured to execute a pre-scan in which a navigator sequence is carried out before the regular scan is executed, said signal processing unit comprises:
a coil element selection unit configured to:
generate an intensity profile indicating a relation between a position in the navigator area in a predetermined direction from a first end thereof close to a high-signal substance to a second end thereof close to a low-signal substance and an intensity of a magnetic resonance signal, with respect to the magnetic resonance signal generated by the navigator sequence in the pre-scan and received at each of said coil elements;

determine a gradient polarity of a profile line corresponding to the high-signal substance in the predetermined direction in the generated intensity profile; and select a coil element of said plurality of coil elements that received a magnetic resonance signal of the intensity profile highest in maximum signal intensity among the intensity profiles the gradient polarity of which was determined to face upward, wherein the position of the region of interest is detected based on a magnetic resonance signal generated by the navigator sequence in the regular scan and received at the selected coil element.

2. The magnetic resonance imaging apparatus according to claim 1, wherein said coil element selection unit is configured to determine the gradient polarity based on the magnitude relation between a representative value of signal intensity in a first range obtained by dividing the intensity profile into a plurality of ranges in the predetermined direction and a representative value of signal intensity in a second range.

3. The magnetic resonance imaging apparatus according to claim 2, wherein each of the ranges has an equal scope.

4. The magnetic resonance imaging apparatus according to claim 2, wherein the plurality of ranges includes four ranges.

5. The magnetic resonance imaging apparatus according to claim 2, wherein the representative value of signal intensity is a signal intensity in the center position in a target range.

6. The magnetic resonance imaging apparatus according to claim 2, wherein the representative value of signal intensity is a sum total or an average value of signal intensity in each position in a target range.

7. The magnetic resonance imaging apparatus according to claim 1, wherein said coil element selection unit is configured to:

detect the position of the region of interest based on at least one of the generated intensity profiles; and determine the gradient polarity based on the magnitude relation between a representative value of signal intensity in a first range starting at the first end and extending to a position at a predetermined distance from the first end in the predetermined direction in the intensity profile and a representative value of signal intensity in a second range starting in the detected position and extending to a position at the predetermined distance in the direction opposite the predetermined direction.

8. The magnetic resonance imaging apparatus according to claim 7, wherein the predetermined distance is a distance equivalent to any distance between 10 millimeters and 30 millimeters in real space.

9. The magnetic resonance imaging apparatus according to claim 1, wherein:

said coil element selection unit is configured to select a first coil element of said plurality of coil elements that received a magnetic resonance signal of the intensity profile highest in maximum signal intensity among the intensity profiles the gradient polarity of which was determined to face upward and a second coil element of said plurality of coil elements that received a magnetic resonance signal of the intensity profile highest in maximum signal intensity among the intensity profiles the gradient polarity of which was determined to face downward; and said signal processing unit is configured to detect the predetermined position based on magnetic resonance signals generated by the navigator sequence and received at the first and second coil elements.

10. The magnetic resonance imaging apparatus according to claim 9, wherein with respect to a signal obtained by synthesizing a magnetic resonance signal received at said first coil element and a magnetic resonance signal received at said second coil element, said signal processing unit is configured to:

generate an intensity profile indicating the relation between a position in the navigator area and the intensity of the synthesized signal; and detect the position of the region of interest based on this intensity profile.

11. The magnetic resonance imaging apparatus according to claim 10, wherein the synthesized signal is a square root of a sum of a square of a magnetic resonance signal received at said first coil element and a square of a magnetic resonance signal received at said second coil element.

12. The magnetic resonance imaging apparatus according to claim 9, wherein the biological movement is based on respiratory movement or heart beat movement.

13. The magnetic resonance imaging apparatus according to claim 9, wherein the region of interest is diaphragm, the high-signal substance is liver, and the low-signal substance is lung.

14. The magnetic resonance imaging apparatus according to claim 1, wherein said plurality of coil elements comprises at least four coil elements placed in proximity to a front of the subject and at least four coil elements placed in proximity to a back of the subject.

15. The magnetic resonance imaging apparatus according to claim 1, wherein said signal processing unit is configured to generate an image based on a magnetic resonance signal generated by an imaging sequence temporally corresponding to a navigator sequence carried out when the detected position of the region of interest is within a predetermined range.

16. The magnetic resonance imaging apparatus according to claim 1, wherein the biological movement is based on respiratory movement or heart beat movement.

17. The magnetic resonance imaging apparatus according to claim 1, wherein the region of interest is diaphragm, the high-signal substance is liver, and the low-signal substance is lung.

18. The magnetic resonance imaging apparatus according to claim 1, wherein the region of interest is a surface area of kidney, the high-signal substance is liver or fat, and the low-signal substance is kidney.

19. The magnetic resonance imaging apparatus according to claim 1, wherein the region of interest is a surface area of head, the high-signal substance is head, and the low-signal substance is air.

20. The magnetic resonance imaging apparatus according to claim 1, wherein said signal processing unit is configured to detect the position of the region of interest using an edge detection method.

* * * * *